(12) United States Patent
Kozlowski

(10) Patent No.: US 11,284,031 B1
(45) Date of Patent: Mar. 22, 2022

(54) SYSTEMS AND METHODS FOR LOW-POWER IMAGE DIGITIZATION

(71) Applicant: Obsidian Sensors, Inc., San Diego, CA (US)

(72) Inventor: Lester Joseph Kozlowski, Simi Valley, CA (US)

(73) Assignee: OBSIDIAN SENSORS, INC., San Diego, CA (US)

( * ) Notice: Subject to any disclaimer, the term of this patent is extended or adjusted under 35 U.S.C. 154(b) by 0 days.

(21) Appl. No.: 16/983,982

(22) Filed: Aug. 3, 2020

Related U.S. Application Data

(63) Continuation of application No. 16/378,913, filed on Apr. 9, 2019, now Pat. No. 10,735,683.

(51) Int. Cl.
*H04N 5/374* (2011.01)
*H04N 5/357* (2011.01)
*H04N 9/04* (2006.01)
*H01L 27/146* (2006.01)
(Continued)

(52) U.S. Cl.
CPC ....... *H04N 5/37455* (2013.01); *H01L 27/146* (2013.01); *H04N 5/3575* (2013.01); *H04N 5/3742* (2013.01)

(58) Field of Classification Search
CPC ............. H04N 5/37455; H04N 5/3742; H04N 5/37457; H04N 5/379; H04N 5/378; H04N 9/045; H04N 5/3575; H04N 5/37451; H04N 5/357; H04N 5/3745; H01L 27/1461; H01L 27/14612; H01L 27/14614; H03M 1/00; H03M 1/1205

USPC ......... 348/308, 241, 243, 294, 222.1, 230.1, 348/297; 257/291, 292, 443, 241, 445, 257/293; 250/208.1, 214 A, 214 LA;
(Continued)

(56) References Cited

U.S. PATENT DOCUMENTS

| | | | |
|---|---|---|---|
| 7,282,685 B2 | 10/2007 | Boemler | |
| 7,570,293 B2 | 8/2009 | Nakamura | |
| 8,169,517 B2 | 5/2012 | Poonnen et al. | |

(Continued)

OTHER PUBLICATIONS

Mirzaie, et al.,"Three-Dimensional Pipeline ADC Utilizing TSV/Design Optimization and Memristor Ratioed Logic" In IEEE Transactions on Very Large Scale Integration (VLSI) Systems, vol. 99, Apr. 2018, pp. 1-9.
(Continued)

*Primary Examiner* — Marly S Camargo
(74) *Attorney, Agent, or Firm* — Calfee, Halter & Griswold LLP

(57) ABSTRACT

A low-power image sensor includes a plurality of light-sensitive pixel cells, a plurality of analog-to-digital converters (ADCs) and image processing circuitry. The image sensor can be disposed in multiple semiconductor layers such that the pixel cells are disposed in a first layer and various other components are disposed in the second layer or between the first layer and the second layer. The image sensor is configured such that the analog output of a pixel cell is sampled by a first ADC and a second ADC within respective first and second dynamic ranges, the second dynamic range being greater than the first dynamic range. The first ADC and the second ADC sample the analog output with different sampling resolutions. The digital outputs of the first ADC and the second ADC are subsequently used by an image processor to generate a pixel value for an image frame.

20 Claims, 7 Drawing Sheets

(51) Int. Cl.
*H03M 1/00* (2006.01)
*H04N 5/3745* (2011.01)

(58) Field of Classification Search
USPC ........ 438/199, 455; 341/108, 110, 116, 126, 341/155
See application file for complete search history.

(56) References Cited

U.S. PATENT DOCUMENTS

| | | | |
|---|---|---|---|
| 8,362,792 | B2 | 1/2013 | Mochizuki |
| 8,605,173 | B2 | 12/2013 | Lee et al. |
| 9,967,472 | B2 | 5/2018 | Koshkin et al. |
| 10,359,423 | B2 * | 7/2019 | Nakajima ............... H04N 19/15 |
| 10,469,849 | B2 * | 11/2019 | Choe ..................... H04N 19/184 |
| 10,735,683 | B1 * | 8/2020 | Kozlowski ......... H04N 5/37455 |
| 2016/0344969 | A1 | 11/2016 | Furukawa et al. |
| 2016/0353035 | A1 * | 12/2016 | Tanaka .................... H04N 5/351 |
| 2017/0094287 | A1 | 3/2017 | Nakajima |
| 2017/0111600 | A1 | 4/2017 | Wang et al. |
| 2017/0201693 | A1 | 7/2017 | Sugizaki et al. |
| 2017/0223367 | A1 * | 8/2017 | Stessen ................ H04N 19/186 |
| 2020/0322641 | A1 * | 10/2020 | Tsukagoshi ............ H04N 19/70 |
| 2020/0412338 | A1 * | 12/2020 | Villalon ................. H03H 11/04 |
| 2021/0258017 | A1 * | 8/2021 | Hino ....................... H03M 1/38 |

OTHER PUBLICATIONS

"Notice of Allowance and Fees Due for United States U.S. Appl. No. 16/378,913", dated Mar. 19, 2020, 13 Pages.

* cited by examiner

SYSTEMS AND METHODS FOR LOW-POWER IMAGE DIGITIZATION

RELATED APPLICATIONS

This application is a continuation of U.S. patent application Ser. No. 16/378,913, filed on Apr. 9, 2019, and entitled "SYSTEMS AND METHODS FOR LOW-POWER IMAGE DIGITIZATION" the entirety of which is incorporated herein by reference.

BACKGROUND

An image sensor is a device that can convert an optical image into an electronic signal. Image sensors are commonly used in still cameras, video cameras, video systems, and other imaging devices. Cameras and other imaging devices generally employ either a charge-coupled device (CCD) image sensor or a complementary metal-oxide-semiconductor (CMOS) image sensor.

CMOS image sensors include an array of light-sensitive pixel cells each of which is typically configured to output an analog voltage that is indicative of light incident on the light-sensitive pixel cell. A CMOS image sensor can further include additional circuitry to convert the analog voltage to digital data, such as analog-to-digital converters (ADCs). Thus, a CMOS image sensor can be an integrated circuit that comprises various analog, digital, mixed-signal, etc. components associated with capturing light and processing imaging related information. Accordingly, a CMOS image sensor can be a system on chip (SoC). For example, components integrated into the CMOS image sensor oftentimes include a processor module (e.g., microprocessor, microcontroller, or digital signal processor (DSP) core), memory, analog interfaces (e.g., analog to digital converters, digital to analog converters), and so forth that may be implemented in a same integrated circuit package. A CMOS image sensor can include multiple supporting blocks that can provide timing control, clock drivers, reference voltages, analog to digital conversion, digital to analog conversion, key signal processing elements, and the like.

Imaging systems implemented using CMOS image sensors can reduce costs, power consumption, and noise while improving resolution as compared to other types of image sensors. High-performance video cameras can thereby be assembled using a single CMOS integrated circuit supported by few components including a lens and a battery, for instance. Accordingly, by leveraging CMOS image sensors, camera size can be decreased and battery life can be increased. Also, dual-use cameras have emerged that can employ CMOS image sensors to alternately produce high-resolution still images or high definition (HD) video.

Recent trends in imaging are evolving toward capture of still images and video at high-frame rates (e.g., 120 frames per second or greater), in ultra-high-resolution (e.g., 3840 by 2160 pixels or greater), and/or with a per-pixel high dynamic range. To meet these demands, conventional CMOS image sensors have generally incorporated a greater number of ADCs and/or higher frequency ADCs to meet faster data rates needed to increase frame rate or resolution, or higher-resolution ADCs to increase the per-pixel dynamic range. Generally, however, increasing the number, frequency, or sampling resolution of ADCs in a CMOS image sensor increases the power required to operate the CMOS image sensor. In some applications, such as handheld still-image or video cameras, the increased power draw reduces battery life. In other applications, such as space-based, airborne, or automotive platforms, increased power requirements of a CMOS image sensor may be prohibitive if a power source used to operate the CMOS image sensor cannot deliver the required power.

SUMMARY

Described herein are various technologies that pertain to low-power image sensors. With more particularity, technologies pertaining to low-power analog-to-digital conversion of analog signals generated by light-sensitive pixel cells (LSPCs) in an image sensor are described herein.

In an exemplary embodiment, an image sensor system includes an array of light-sensitive pixel cells. Each of the pixel cells is a circuit that is configured to output an analog voltage responsive to light being incident on the pixel cell. By way of example, each of the pixel cells can include a photodetector that outputs an electric current responsive to light being incident on the photodetector, wherein the electric current causes a voltage that is indicative of the incident light to be developed at a point in the pixel cell. The image sensor can further include a readout circuit that is configured to read out signals from the pixel cells (e.g., the voltage developed by a pixel cell that is indicative of the incident light received at the pixel cell). The image sensor further comprises an ADC circuit that converts analog signals developed by the pixel cells (e.g., the voltage that is indicative of the light received at the pixel cell, for example as read out by the readout circuit) to digital pixel values that are representative of the analog signals. Subsequently, an output frame can be generated based on the digital pixel values (e.g., by an image processing circuit included on or in communication with the image sensor).

In accordance with various embodiments of an exemplary image sensor, the ADC circuit can comprise a first ADC and a second ADC. The first ADC can be configured to sample analog signals output by the pixel cells in a first dynamic range, whereas the second ADC can be configured to sample analog signals output by the pixel cells in a second dynamic range (e.g., that is greater than the first dynamic range). By way of example, the first ADC can be configured to sample the analog signals within a first dynamic range that extends from a voltage corresponding to a lowest light level, or black level, through a voltage corresponding to a light-level in the middle-grays. Continuing the example, the second ADC can be configured to sample the analog signals in a second dynamic range that extends through most of or the entirety of the dynamic range of the image sensor (e.g., from a voltage corresponding to a lowest light-level detectable by the image sensor through a voltage corresponding to a highest light-level detectable by the image sensor).

By sampling the analog output of a pixel cell using multiple ADCs that sample across different portions of the dynamic range of the analog outputs, the different portions can be sampled differentially to reduce the power consumption otherwise required to adequately span the full dynamic range with a desired fidelity from the pixel's zero, or black, level to full saturation, or white. The two samples together constitute an aggregate, per-pixel dynamic range much larger than either of the two individual samples.

By way of example, the first ADC can sample the first dynamic range with a greater quantizing resolution than the quantizing resolution used by the second ADC to sample the second dynamic range. The aggregate resolution is larger than either of the samples, with the highest accuracy dedicated to the most important part of the pixel's signal, from black to mid-grey, where the fidelity of texture capture is critical for still and video capture. Photographers and cinematographers typically produce their finest and human-pleasing images when carefully capturing information-rich shadows encompassing black through mid-grey—the zones of color and black and white images that are most attractive to the human eye.

Furthermore, the photon shot noise of an optical signal (e.g., light received at the array of pixel cells) dramatically increases as the intensity of the optical signal increases. Therefore, if the optical signal is sampled at a same quantizing resolution at a lower end of the dynamic range as at a higher end of the dynamic range, the two values only a single least significant bit of the ADC output away from one another at the lower end of the dynamic range are highly meaningful and help create an image's cinematographic magic. On the other hand, the two values only a least significant bit away from one another at the higher end of the dynamic range will likely not represent an especially observable difference in optical signal intensity to the human eye. Instead, such differences in light gray and shades of white may be merely due to photon shot noise on a sample-by-sample basis.

Therefore, in the exemplary image sensors described herein, a higher end of the dynamic range of the image sensor is sampled with a lower sampling resolution to avoid wasting power to simply sample shot noise. In general, this allows ADCs that consume less total power to be used to sample each of the pixel cells in a much more efficient manner.

In the exemplary image sensors described herein, the first and second ADCs can be configured to have different performance parameters in addition to sampling different portions of a dynamic range of the analog output of a pixel cell. In non-limiting examples, the first ADC can be one of a plurality of similarly-configured ADCs, each of which is configured to sample analog outputs of pixel cells in a respective column of an array of pixel cells. In various embodiments, the second ADC can be a block parallel ADC that samples analog outputs of pixel cells in multiple columns of the array of pixel cells. In additional embodiments, the first ADC can have a lower sampling frequency than the second ADC. By way of example, the first ADC can be configured to sample the analog outputs of a lesser number of pixel cells per unit time than the second ADC. In such embodiments, the first ADC and the second ADC can be configured to have respective sampling frequencies such that the first ADC and the second ADC finish sampling their assigned analog signals in approximately a same amount of time.

Subsequent to sampling of the analog outputs of the pixel cells by the ADCs, digital pixel values output by the first ADC and the second ADC can be received at an image processing circuit. The image processing circuit outputs an image based on the digital pixel values, the image comprising data indicative of values of pixels that make up the image. In an example, the first ADC can output a first digital pixel value indicative of light received at a first pixel cell. The second ADC can output a second digital pixel value that is also indicative of light received at the first pixel cell, wherein the first digital pixel value and the second digital pixel value may be different. The image processing circuit assigns a pixel value to a first pixel of the image (e.g., at a location corresponding to a location of the first pixel cell in the array of pixel cells) based upon the first digital pixel value and the second digital pixel value. By way of example, the image processing circuit can assign either the first digital pixel value or the second digital pixel value to the first pixel of the image. In an exemplary embodiment, the first digital pixel value or the second digital pixel value can be selected by the image processing circuit based upon where in the dynamic range of the image sensor the first and second digital pixel values lie. In another example, the image processing circuit can compute a value for the first pixel of the image based upon the digital pixel values output by the ADCs, where the value of the first pixel is different than the digital pixel values output by the ADCs.

For pixels having signal level within the range of the first ADC, the apparatus and methodology would allow the second ADC to either not sample the pixel a second time to save power, or increase the resolution of the first ADC's sample via the second quantization of the second ADC. Owing to the self-calibration of the ADC system, the full-scale extent of the second ADC can be appropriately adjusted on-the-fly to further improve digitization accuracy.

Power consumption of an image sensor can further be reduced by positioning various components of an image sensor in different semiconductor layers. By way of example, and not limitation, an image sensor can include an array of pixel cells in a first semiconductor layer and an image processing circuit in a second semiconductor layer. In exemplary embodiments, the first semiconductor layer can be manufactured according to a first semiconductor manufacturing process that is suitable for making a pixel cell array that operates efficiently at lower speeds and higher precision at lower manufacturing cost than possible if integrated into an "analog plus high-speed digital" CMOS technology as used for the majority of today's CMOS image sensors. The second semiconductor layer can be manufactured according to a second semiconductor manufacturing process that is suitable or optimized for manufacturing high-speed, low-power digital circuitry. In various embodiments, pixel cells can be formed in the first semiconductor layer whereas other componentry such as input/output (I/O) circuitry, image processing circuitry, etc. can be formed in the second semiconductor layer. In further embodiments, ADCs of the image sensor can be split between the first semiconductor layer and the second semiconductor layer. By way of example, analog portions of the ADCs of the image sensor can be positioned in the first semiconductor layer while digital portions of the ADCs can be positioned in the second semiconductor layer. While two layers are used to constitute the stacked image sensor, selective integration of the various circuit blocks in the two layers to optimize functionality also reduces the costs of each separate layer to enable cost-effective commercial image sensors.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
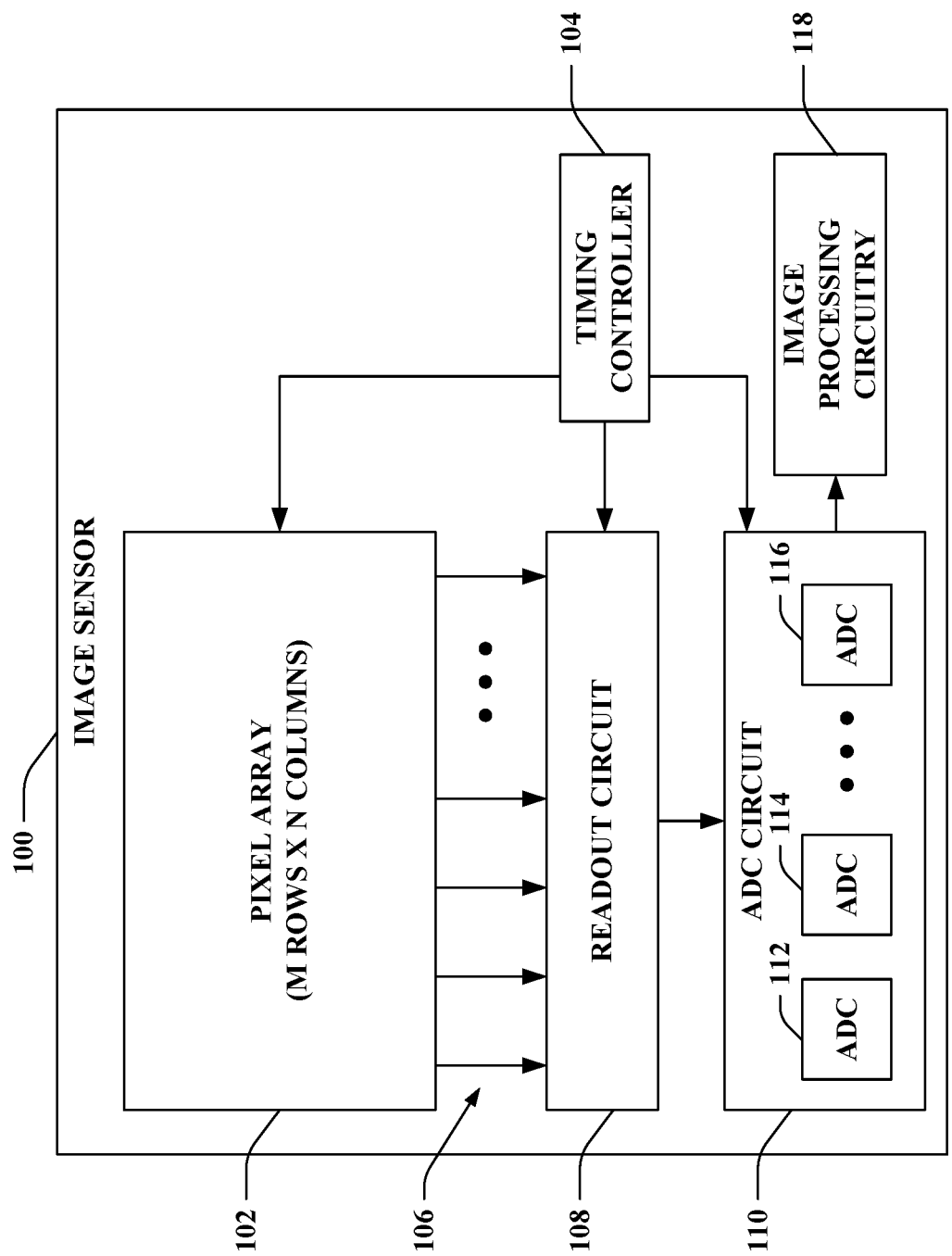
FIG. 1 illustrates an exemplary low-power image sensor.

Various technologies pertaining to low-power image sensors having high dynamic range are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Image sensors described herein have reduced power consumption as compared to conventional image sensors, while maintaining a same or greater dynamic range. With more specificity, image sensors described herein consume less power to digitally sample analog signals output by light-sensitive pixel cells than conventional image sensors.

Referring now to the drawings, FIG. 1 illustrates an exemplary image sensor 100. The image sensor 100 can be or include a CMOS image sensor SoC. According to various examples, a camera, a video system, a medical imaging device, an industrial imaging device, a microscope, or the like can include the image sensor 100. Examples of a camera that can include the image sensor 100 include a digital camera, a videoconference camera, a broadcast video camera, a cinematography camera, a surveillance video camera, a handheld video camera, a camera integrated into a computing device, a high dynamic range implementation of a camera, and so forth. Moreover, examples of computing devices (which can include the image sensor 100 as part of a camera) include a desktop computing device, a mobile computing device (e.g., a laptop computing device, a mobile telephone, a smartphone, a tablet computing device, a wearable computing device, a handheld computing device, a portable gaming device, a personal digital assistant), a gaming console, an in-vehicle communications and infotainment system, or the like.

The image sensor 100 includes a pixel array 102. The pixel array 102 can include M rows and N columns of light-sensitive pixel cells, where M and N can be any non-zero integers. Each pixel cell in the pixel array 102 can comprise a photodetector (e.g., phototransistor, photogate, photoconductor, photodiode) that overlays a substrate to generate a photo-generated charge. Each pixel can also include a source follower transistor and a floating diffusion region connected to a gate of the source follower transistor. Accordingly, charge generated by the photodetector can be sent to the floating diffusion region to convert the charge to a voltage that is readable by transistor elements and can be processed by signal processing circuits, either within the pixel cell or in other parts of the pixel array 102 (or other parts of the image sensor 100). Further, each pixel can include a transistor for transferring charge from the photodetector to the floating diffusion region and another transistor for resetting the floating diffusion region to a predetermined charge level prior to charge transference. It is to be appreciated, however, that the claimed subject matter is not limited to the foregoing, as other pixel architectures are intended to fall within the scope of the hereto appended claims.

The image sensor 100 includes a timing controller 104 configured to control timing of various operations of elements of the pixel array 102. The timing controller 104 can further be configured to control timing of operation of various components of readout circuit 108, and/or the ADC circuit 110.

The image sensor 100 can also include a plurality of read buses 106 and a readout circuit 108. The readout circuit 108 can be configured to read out signals (e.g., voltages) from the pixel cells in the pixel array 102 for subsequent sampling by an ADC. The signals can be transferred from the pixels in the pixel array 102 via the read buses 106 to the readout circuit 108. In an exemplary embodiment, the image sensor 100 can include N read buses 106, where each of the read buses 106 can be associated with a respective column of pixel cells of the pixel array 102. By way of another example, columns of the pixel array 102 can share read buses 106, and thus, the image sensor 100 can include fewer than N read buses 106. Pursuant to yet another example, each column of the pixel array 102 can be associated with more than one read bus, and thus, the image sensor 100 can include more than N read buses 106.

The readout circuit 108 can further include voltage amplifier(s) that amplify the signals (e.g., voltages) read out from the pixels of the pixel array 102. For example, the readout circuit 108 can include N voltage amplifiers (e.g., a voltage amplifier for each column of the pixel array 102). According to another example, the readout circuit 108 can include fewer than N voltage amplifiers (e.g., columns of the pixel array 102 can share voltage amplifiers). In accordance with yet another example, the readout circuit 108 can include more than N voltage amplifiers. Owing to the flexibility of the present invention to support multiple vertical column buses to support each column, higher frame rate image sensors can include more than N voltage amplifiers at both the top and bottom of the image sensor.

The readout circuit 108 can further include sampling elements that are configured to sample analog voltages developed by the pixel cells of the pixel array 102 (e.g., as output by voltage amplifiers included in the readout circuit 108). By way of example, the readout circuit 108 can include a plurality of sample-and-hold circuits that are respectively coupled to corresponding outputs of the voltage amplifiers of the readout circuit 108. By way of illustration, an amplified signal output by a particular voltage amplifier of the readout circuit 108 can be provided to a corresponding sample-and-hold circuit. Each of the sample-and-hold circuits can be configured to retain an analog value of a received signal for some period of time until the analog value is to be used by another component of the image sensor 100. For instance, the sample-and-hold circuits can retain analog values for subsequent sampling by an ADC.

The image sensor 100 further includes an ADC circuit 110. The ADC circuit 110 can be configured to convert analog signals read out by the readout circuit 108 to pixel values (e.g., digital pixel values) for the pixel cells in the pixel array 102. Thus, a voltage read out from a particular pixel cell of the pixel array 102 by the readout circuit 108 can be converted to a digital pixel value for the particular pixel cell by the ADC circuit 110. According to another illustration, amplified analog signals held by sample-and-hold circuits of the readout circuit 108 can be converted by the ADC circuit 110 to corresponding pixel values. The ADC circuit 110 includes a plurality of ADCs 112-116. Each of the ADCs 112-116 is configured to perform analog to digital conversion over analog signals output by one or more of the pixel cells in the pixel array 102 (e.g., as read out by the readout circuit 108). The ADCs 112-116 output digital pixel values indicative of the analog signals output by the pixel cells. The ADCs 112-116 may be embodied by any of a variety of different types of ADC, including, but not limited to, ramp-compare ADCs of single or multiple slopes, successive-approximation ADCs, flash ADCs, integrating ADCs, sigma-delta ADCs, etc.

The ADCs 112-116 are collectively configured such that the ADC circuit 110 performs analog-to-digital conversion over the analog signals output by each of the pixel cells of the pixel array 102 at least twice. With more particularity, the ADCs 112-116 are configured such that the ADC circuit 110 performs a first analog-to-digital conversion over an analog signal output by a first pixel cell in the pixel array 102 in a first dynamic range. The ADC circuit 110 further performs a second analog-to-digital conversion over the analog signal output by the first pixel cell in a second dynamic range. By way of example, and not limitation, a first ADC 112 in the ADCs 112-116 can be configured to perform analog-to-digital conversion of an analog signal output by a pixel in the pixel array 102 in a first dynamic range. Continuing the example, a second ADC 114 in the ADCs 112-116 can be configured to perform analog-to-digital conversion over the same pixel in a second dynamic range. Subsequently, digital values generated by the ADCs 112-116 are output to image processing circuitry 118 that is configured to determine a pixel value for pixels pixel in an image based upon the digital values output by the ADCs 112-116. By way of example, the image processing circuitry 118 can determine a pixel value for a first pixel in the image based upon a digital pixel value generated for the first pixel by the first ADC 112, and another digital pixel value generated for the first pixel by the second ADC 114.

It is to be understood that as used herein, the dynamic range of an ADC refers to the range between a low value below which a sampled signal cannot be distinguished from the low value, and a high value above which the sampled signal cannot be distinguished from the high value. Furthermore, while the image processing circuitry 118 is shown as being included in the image sensor 100, it is to be understood that the image processing circuitry 118 can be embodied as componentry that is separate and distinct from the image sensor 100. In such embodiments, the image processing circuitry 118 can be in communication with the image sensor 100 by way of any suitable communications interface between the image sensor 100 and the image processing circuitry 118, either within the imaging SoC or external to it.

By sampling the analog output of each pixel cell in two different dynamic ranges, the ADC circuit 110 can be configured to use lower-power ADCs than required by a conventional image sensor. As noted above, the photon shot noise of an optical signal (e.g., light received at the pixel cell array 102) increases as the intensity of the optical signal increases. Thus, if the whole dynamic range of the pixel cell is sampled with a same sampling resolution, two values that are only a single least significant bit away from one another at the higher end of the dynamic range may not be indicative of a difference in true optical signal intensity. Instead, such difference may be merely due to photon shot noise. The total dynamic range of the image sensor 100 can therefore be sampled differentially by the ADCs 112-116 such that a first portion of the total dynamic range is sampled with a first sampling resolution and a second portion of the total dynamic range is sampled with a second sampling resolution. Furthermore, the information provided by the first sample at lower sampling frequency can be provided to image processing circuitry 118 to either not sample the signal with the second ADC in order to further save power, or to optionally increase the enacted resolution of the second sample to, for example, enhance the quality of the captured black through grey level signals.

By contrast, a conventional image sensor generally employs an ADC that samples the entire dynamic range with a same sampling resolution at a high frequency. For instance, the conventional image sensor can employ an ADC that applies a 12 or greater-bit sampling resolution to the whole dynamic range of the conventional image sensor at a sampling frequency of greater than 1 GHz in order to generate 12 or greater-bit pixel data. The conventional high-resolution, high-frequency ADC that samples the entire dynamic range of the conventional image sensor generally consumes more power than ADCs included in image sensors configured in accordance with technologies described herein (e.g., five times as much power, seven times as much power, or ten times as much power in various embodiments). Technologies set forth herein are therefore well-suited to reducing power consumption of image sensors while delivering similar or improved image quality.

As noted above, the first dynamic range of the first ADC 112 extends from a lowest value that can be distinguishably sampled by the ADC 112 to a highest value that can be distinguishably sampled by the ADC 112. The second dynamic range of the second ADC 114 extends from a lowest value that can be distinguishably sampled by the ADC 114 to a highest value that can be distinguishably sampled by the ADC 114. The second dynamic range is greater than the first dynamic range. Stated differently, the ADC 114 samples analog values in a range that has a greater difference between the lowest distinguishable value and the highest distinguishable value than for the ADC 112.

In exemplary embodiments, the second dynamic range of the ADC 114 extends along substantially the entire total dynamic range of the image sensor 100, whereas the first dynamic range of the ADC 112 extends along only a portion of the total dynamic range of the image sensor 100. By way of further example, the first dynamic range of the first ADC 112 can extend from an analog voltage level that corresponds to a lowest light level detectable by the pixel cells in the pixel array 102 (e.g., a black level of the image sensor 100) through an analog voltage level that corresponds to a light level in the middle grays (e.g., approximately one-fourth, one-third, or one-half of a total dynamic range of the image sensor 100). Thus, in various embodiments, the ADC 112 samples a lower portion of the total dynamic range of the image sensor 100 (e.g., corresponding to lower intensities of light received at the pixel array 102).

The ADC 112 that has the smaller dynamic range (e.g., corresponding to lower intensities of light received at the pixel array 102) can be configured to sample the smaller dynamic range with a greater sampling resolution than the sampling resolution used by the ADC 114 to sample the larger dynamic range. Stated differently, the voltage value of the least significant bit (LSB) of the digital output of the ADC 112 that has the smaller dynamic range is lower than the voltage value of the LSB of the digital output of the ADC 114 that has the larger dynamic range. The ADC 112 therefore samples the smaller dynamic range with greater precision than the ADC 114 samples the larger dynamic range. In exemplary embodiments, the ADC 112 samples a lower portion of the total dynamic range of the image sensor 100 with the greater sampling resolution. In such embodiments, the ADC 114 samples a higher portion of the total dynamic range of the image sensor 100 with a lesser sampling resolution than the ADC 112 samples the lower portion of the total dynamic range. The absolute level of shot noise of the optical signal received at the array 102 increases as the intensity of the optical signal increases. Therefore, the ADC 114 can sample the higher ends of the total dynamic range of the image sensor 100 with the lesser sampling resolution without losing information of significance to resultant image quality relative to the true optical signal received at the array 102. In various embodiments, the white levels can be compressed via gamma processing or various S-curve embodiments.

In order to best support imaging at low-light levels, an exemplary embodiment samples the lower part of the pixel's dynamic range using both ADCs to optimize low-light-level imaging. The second ADC can be reprogrammed to cover the same dynamic range as the first ADC, or various options that can be specifically optimized for still capture, automotive, cell phone, consumer video, cinematographic, etc., applications.

In connection with generating an image frame, the image processing circuitry 118 can be configured to generate a digital pixel value for each of the pixel cells in the pixel array 102. For each of the pixel cells in the array 102, the image processing circuitry 118 receives two digital values from the ADCs 112-116. By way of example, for a first pixel in the pixel array 102, the image processing circuitry 118 receives a first digital value from a first ADC (in the ADCs 112-116) that samples the analog output of the first pixel in the smaller dynamic range with the greater sampling resolution. The image processing circuitry 118 receives a second digital value from a second ADC (in the ADCs 112-116) that samples the analog output of the first pixel in the greater dynamic range with the lesser sampling resolution. Based upon the first digital value and the second digital value, the image processing circuitry 118 generates a digital pixel value for the first pixel. The image processing circuitry 118 can use any of various image composition algorithms to generate the digital pixel value based upon the first digital value output by the first ADC and the second digital value output by the second ADC. The image processing circuitry 118 can repeat these operations for each of the pixel cells in the pixel array 102. In other words, for each of the pixel cells in the pixel array 102 the image processing circuitry 118 receives two digital values from a pair of ADCs in the ADC circuit 110 and generates a digital pixel value for the pixel cell based upon the digital values. The image processing circuitry 118 then generates an image frame by assigning the generated digital pixel values to the pixels of the image frame.

In a non-limiting example, in connection with generating 12-bit pixel data for each pixel in an image, the first ADC 112 can sample the output of a pixel cell in the smaller first dynamic range to generate a digital output of greater than or equal to 8 and less than or equal to 10 bits. Continuing the example, the second ADC 114 can sample the pixel cell output in the greater second dynamic range (e.g., the total dynamic range of the image sensor 100) to generate a digital output of greater than or equal to 6 and less than or equal to 8 bits. The image processing circuitry 118 can subsequently determine a digital pixel value of 12 bits or more for the output of a pixel cell in the array 102 based on the output of the first ADC 112 and the second ADC 114.

In addition to outputting image data (e.g., digital values of analog signals output by the pixel cells of the array 102 and read out by the readout circuit 108), the ADCs 112-116 can be configured to output calibration data to the image processing circuitry 118. The calibration data is usable by the image processing circuitry 118 to generate imagery based upon the image data output by the ADCs 112-116. The calibration data output by an ADC in the ADCs 112-116 can include, for example, a digital value corresponding to the black level at the ADC, digital values of one or more gray levels at the ADC, the value at maximum extent of the converter dynamic range, and the like. By passing calibration data from each of the ADCs 112-116 the image processing circuitry 118 can correct for measurement offsets among the ADCs 112-116. The exemplary image sensor 100 therefore does not need to have performance tolerances among the ADCs 112-116 that are as tight as tolerances among ADCs in a conventional image sensor.

Figure 2:
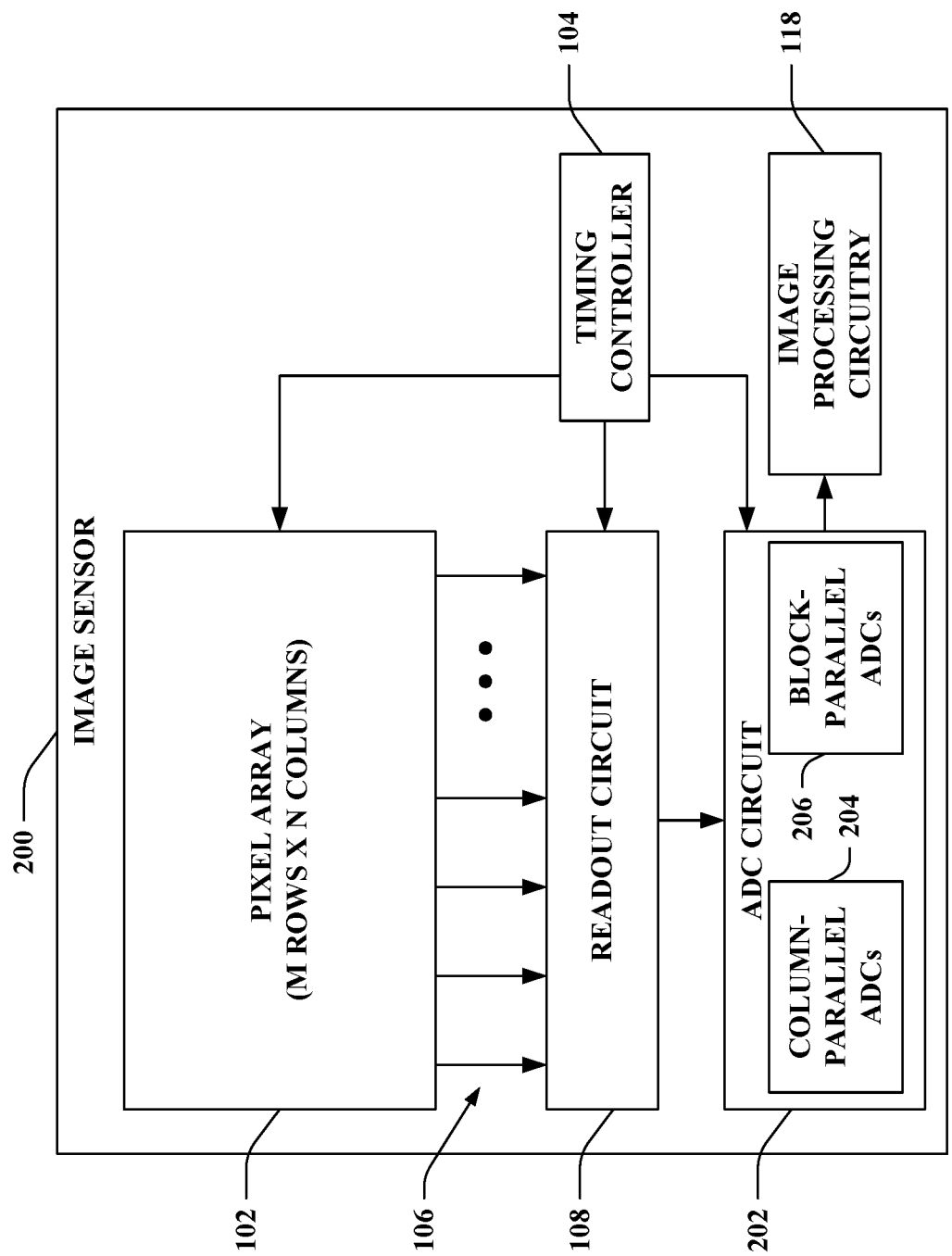
FIG. 2 illustrates another exemplary low-power image sensor.
Figure 3:
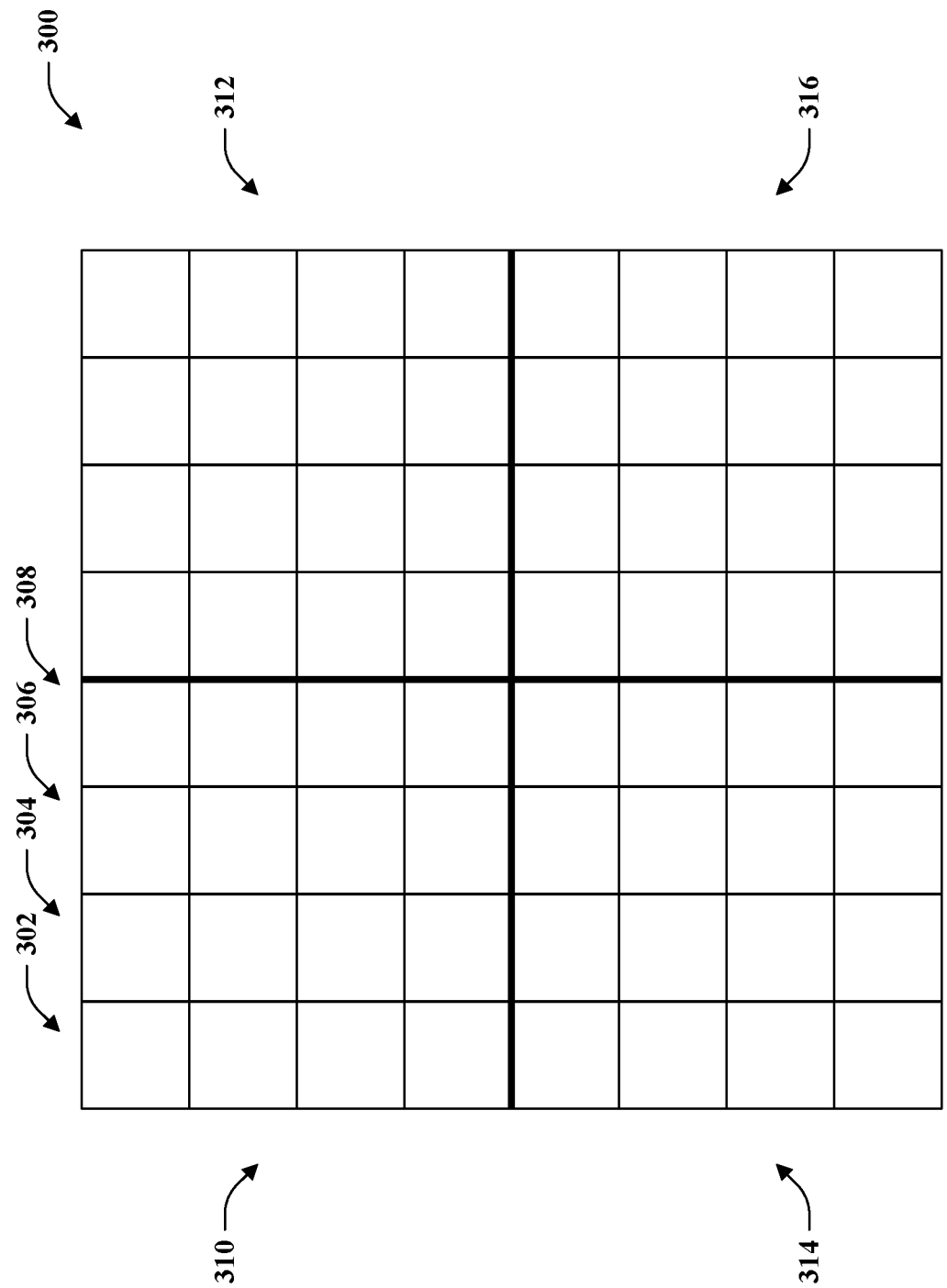
FIG. 3 illustrates an exemplary portion of a pixel array and various sub-portions that can be assigned to various ADCs in an image sensor.

Referring now to FIG. 2, another exemplary image sensor 200 that includes a low-power ADC circuit 202 is shown. The image sensor 200 comprises the pixel array 102, the timing controller 104, the buses 106, and the readout circuit 108 as set forth above with respect to the image sensor 100. The ADC circuit 202 receives analog signals output by the pixel cells in the pixel array 102 from the readout circuit 108. The ADC circuit 202 includes a plurality of column-parallel ADCs 204 and a plurality of block-parallel ADCs 206. The column-parallel ADCs 204 are configured such that each of the column-parallel ADCs 204 performs analog to digital conversion of signals output by pixel cells in a respective column of pixel cells in the pixel array 102. By way of example, and referring now briefly to FIG. 3, an exemplary 8×8 array 300 of light-sensitive pixel cells is shown. The column-parallel ADCs 204 can be configured such that a first column-parallel ADC in the ADCs 204 performs analog-to-digital conversion over signals output by pixel cells in a first column 302 of the array 300, a second column-parallel ADC in the ADCs 204 performs analog-to-digital conversion over signals output by pixel cells in a second column 304 of the array 300, and so on.

The block-parallel ADCs 206 are configured such that each of the block-parallel ADCs 206 performs analog-to-digital conversion over signals output by pixel cells in multiple columns of the pixel array 102. By way of example, and referring again to FIG. 3 a first block-parallel ADC in the ADCs 206 can perform analog-to-digital conversion over all of the pixels in both the first column 302 and the second column 304. Continuing the example, a second block-parallel ADC in the ADCs 206 can perform analog-to-digital conversion over all of the pixels in a third column 306 and a fourth column 308 of pixel cells in the pixel array 300. The block-parallel ADCs 206 can be configured to perform analog-to-digital conversion over signals output by pixel cells in other geometric arrangements. Accordingly, in another example, the pixel array 300 is subdivided into square or rectangular sections 310-316. Each of the sections 310-316 can be assigned a different block-parallel ADC in the block-parallel ADCs 206 such that the assigned block-parallel performs analog-to-digital conversion over signals output by pixel cells in its corresponding section.

In exemplary embodiments, each of the block-parallel ADCs 206 performs analog-to-digital conversion of analog signals output by a greater number of pixel cells than each of the column-parallel ADCs 204. In such embodiments, the block-parallel ADCs 206 are configured to have higher sampling frequencies than the column-parallel ADCs 204. In a non-limiting example, the block-parallel ADCs 206 can hence be time-interleaved ADCs. Each of the time-interleaved ADCs further includes a plurality of constituent ADCs with their operations interleaved in time to yield a greater sampling frequency for the time-interleaved ADC than any of the constituent ADCs individually.

The column-parallel ADCs 204 each sample outputs of the pixel cells within a lesser signal extent or dynamic range than the block-parallel ADCs 206. In an example, each of the column-parallel ADCs 204 samples the signals output by pixel cells within a dynamic range that extends from a lowest light level of the image sensor 200 through a fraction of the total dynamic range of the image sensor 200 (e.g., less than or equal to one-fourth of the total dynamic range, less than or equal to one-third of the total dynamic range, or less than or equal to one-half of the total dynamic range). Each of the block-parallel ADCs 206 can sample the output of pixel cells within the full dynamic range of the image sensor 200. In exemplary embodiments, the column-parallel ADCs 204 sample the signals output by the pixel cells with a first sampling resolution. In the embodiments, the block-parallel ADCs 206 sample the signals output by the pixel cells with a second sampling resolution that is less than the first sampling resolution of the column-parallel ADCs 204.

As noted above with respect to the ADC circuit 110, the ADCs 204, 206 of the ADC circuit 202 are configured such that for each image frame captured by the image sensor 200, the ADC circuit 202 digitally samples the analog output of each of the cells of the pixel array 102 twice. With more particularity, the ADCs 204, 206 are configured such that for each image frame captured, each of the pixels of the pixel array 102 is sampled by one of the column parallel ADCs 204 and one of the block-parallel ADCs 206.

Figure 4:
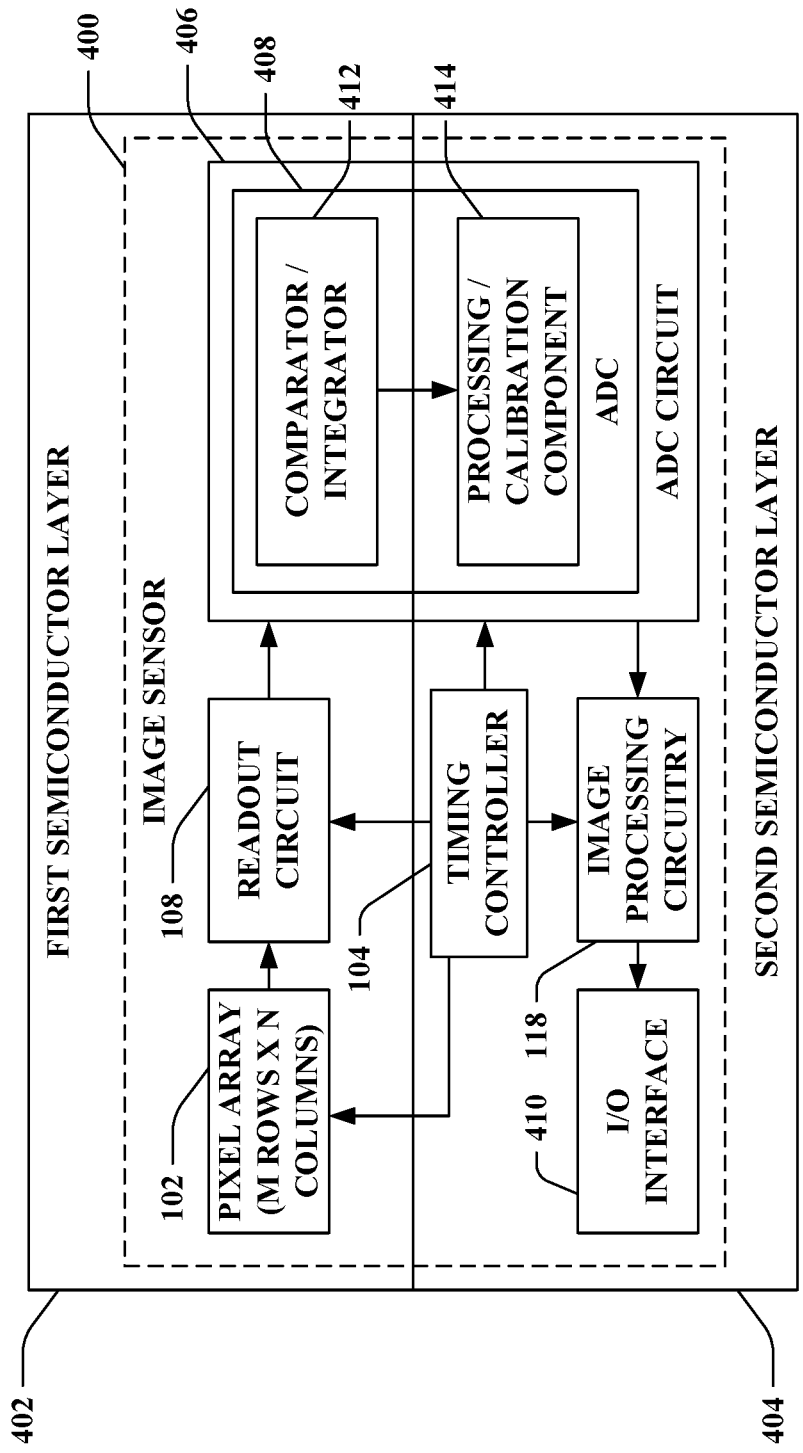
FIG. 4 illustrates yet another exemplary low-power image sensor with components disposed in multiple semiconductor layers.

In various embodiments, image sensors described herein (e.g., the image sensors 100, 200) can be formed in multiple stacked semiconductor layers. With reference now to FIG. 4, an exemplary image sensor 400 is shown, wherein the image sensor 400 is formed in a first semiconductor layer 402 and a second semiconductor layer 404. The semiconductor layers 402, 404 can be formed from silicon, or any other suitable semiconductor. In an exemplary embodiment, the first semiconductor layer 402 is formed by way of a first manufacturing process and the second semiconductor layer is formed by way of a second manufacturing process. The manufacturing processes can include advanced devices types, such as SiGe photodiodes or transistors as a consequence of the use of multiple layers with independently optimized process technologies, depending on the application. SiGe photodiodes can support near-infrared and infrared imaging. SiGe transistors can support the high speed digitization of the second ADC. By way of example, and not limitation, the first semiconductor layer 402 can be formed by way of a 65 nanometer process or a 45 nanometer process. By way of further non-limiting example, the second semiconductor layer 404 can be formed by way of a 22 nanometer process, a 14 nanometer process, or a 7 nanometer process. By way of further non-limiting example, the image sensor designer can floor plan circuit blocks and optimally distribute functionality to fully leverage each layer's maximum performance capability while likely lowering the cost relative to a single layer image sensor combining all of the process technology.

The various embodiments hence describe a "more-than-Moore" solution that reduces costs and power while enhancing performance as compared to present technology following the so-called "Moore's Law."

The image sensor 400 includes the pixel array 102, the timing controller 104, the readout circuit 108, and the image processing circuitry 118. The image sensor 400 further includes an ADC circuit 406 that includes at least one ADC 408. The image sensor 400 can optionally include an input/output (I/O) interface 410 that can be configured to output images generated by the image processing circuitry 118 to another device (e.g., a mobile computing device such as a smartphone, or other componentry of a camera in which the image sensor 400 is included).

The pixel array 102 is disposed in the first semiconductor layer 402. The first semiconductor layer 402 can be manufactured according to a semiconductor manufacturing process that yields feature sizes with which pixel cells of the pixel array 102 can be operated efficiently. By way of example, and not limitation, pixel cells manufactured using a 65 nanometer semiconductor fabrication process have been found to have desirable performance characteristics at a production cost representing a competitive minimum, and accordingly the first semiconductor layer 402 can be manufactured according to a 65 nanometer fabrication process. It is to be understood, however, that other semiconductor fabrication processes may be used to form the first semiconductor layer 402 as fab depreciation effectively shifts and minimizes wafer production costs. The readout circuit 108 can also be disposed in the first semiconductor layer 402.

In various embodiments, analog componentry of the image sensor 400 can be disposed in the first semiconductor layer 402, whereas digital componentry of the image sensor 400 can be substantially disposed in the second semiconductor layer 404. In non-limiting examples, analog components such as the pixel array 102 and the readout circuit 108 can be disposed in the first semiconductor layer, while digital components such as the image processing circuitry 118, the timing controller 104, and the I/O interface 410 can be included in the second semiconductor layer 404. The first semiconductor layer 402 can hence be manufactured to optimize, for example, photodiode quality, including dark current performance and quantum efficiency while improving pixel yield, reducing implant processing steps and cutting production cost. The second semiconductor layer 404 can therefore be manufactured according to a process that yields greatest performance of the digital components of the image sensor 400 (e.g., the image processing circuitry 118, the I/O interface, the timing controller 104), without compromising performance of the pixel cells of the pixel array 102, which deliver higher performance when manufactured using a different process as compared to those used for fully digital integrated circuits.

Components of the image sensor 400 that include both analog elements and digital elements can be distributed between the first semiconductor layer 402 and the second semiconductor layer 404. In one exemplary embodiment, the ADC circuit 406 is distributed between the first semiconductor layer 402 and the second semiconductor layer 404 such that analog components of the ADC circuit 406 are disposed in the first semiconductor layer 402 and digital components of the ADC circuit 406 are disposed in the second semiconductor layer 404. For instance, the ADC 408 can include analog componentry such as a comparator or integrator 412, and digital componentry such as a processing or calibration component 414. In a non-limiting example, the comparator/integrator 412 is disposed in the first semiconductor layer 412, the same semiconductor layer as other analog elements such as the pixel array 102 and the readout circuit 108. The processing/calibration component 414 of the ADC 408, which includes various digital components of the ADC 408, can be disposed in the second semiconductor layer 404. Thus, analog portions and digital portions of the ADC 408 can be distributed between the layers 402, 404 according to a layer in which they will operate most efficiently.

It is to be understood that various connections may be made between the layers 402, 404 to facilitate communication between analog and digital components of the image sensor 400. By way of example, connections may be formed between the timing controller 104 that is positioned in the second semiconductor layer 404 and the pixel array 102, readout circuit 108 and analog portions of the ADC 408 that are positioned in the first semiconductor layer 402. In another example, various connections can be formed between the comparator/integrator 412 positioned in the first semiconductor layer 402 and the processing/calibration component 414 positioned in the second semiconductor layer 404.

While various components of an image sensor 400 are shown in block diagram form as being disposed in the semiconductor layers 402, 404, it is to be understood that FIG. 4 is not intended to imply a particular geometric arrangement of such components within such layers 402, 404. For instance, the componentry of the image sensor 400 described as being positioned within the semiconductor layers 402, 404 can be positioned in such layers in substantially any suitable geometric arrangement.

Figure 5:
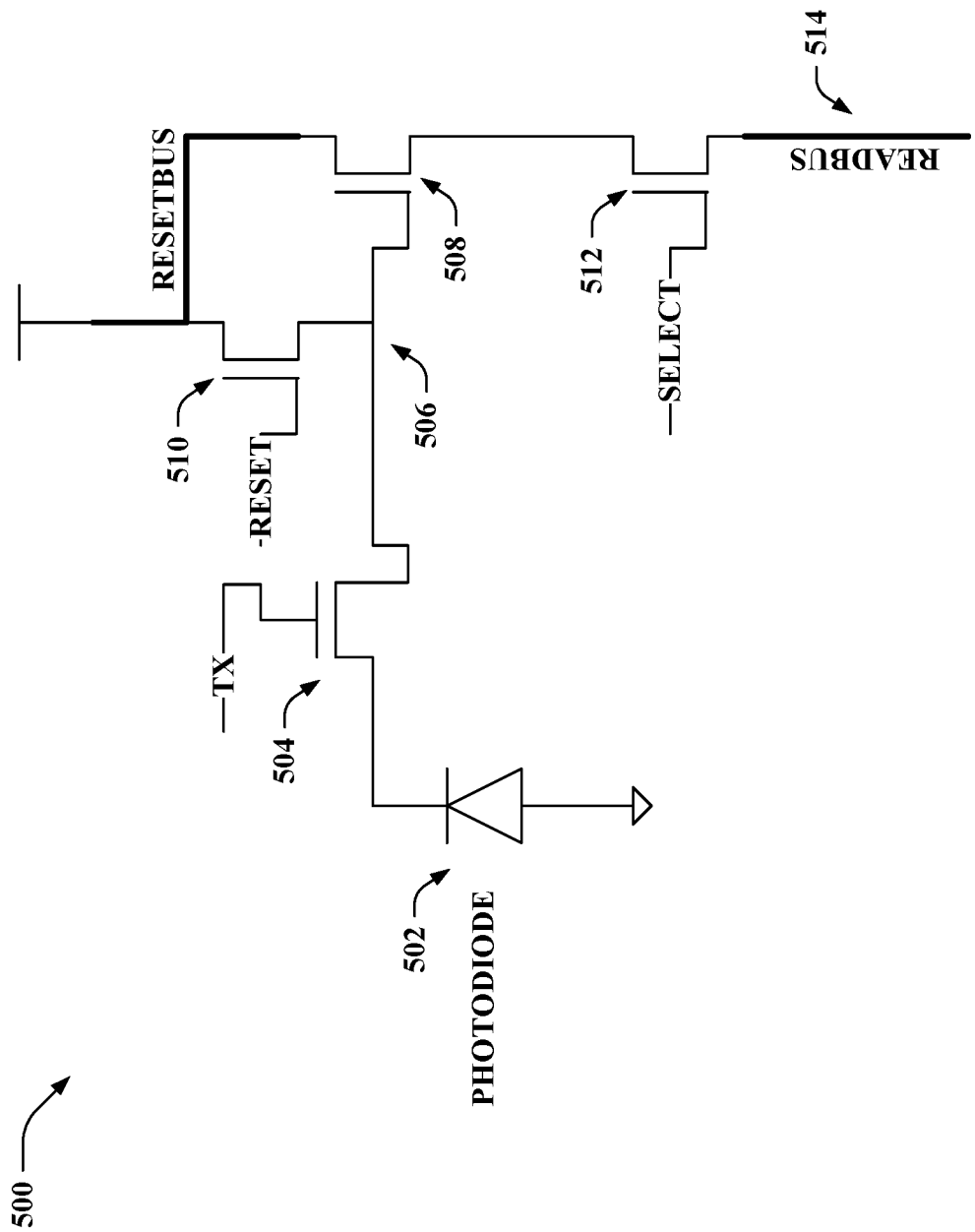
FIG. 5 illustrates a schematic diagram of an exemplary CMOS image sensor pixel that can be included in a pixel array.

Now turning to FIG. 5, an exemplary CMOS image sensor pixel cell 500 that can be included in a pixel cell array (e.g., the pixel array 102 of FIG. 1) is shown. The pixel 500 as depicted is a 4T pixel cell that can be utilized in a CMOS image sensor system on chip. The pixel 500 includes a photodiode 502 connected to a transfer transistor 504. The transfer transistor 504 is further connected to a floating diffusion region 506. The floating diffusion region 506 connects to a source follower transistor 508 and a reset transistor 510. The source follower transistor 508 is further connected to a select transistor 512. The select transistor 512 can be employed to select a particular row of pixel cells from a pixel array. For instance, a select signal can be received at a gate of the select transistor 512 to read out a value from the floating diffusion region 506.

The photodiode 502 can be charged by converting optical energy to electrical energy. For instance, the photodiode 502 can have sensitivity to a particular type of incident light (e.g., red light, blue light, green light). Yet, it is to be appreciated that the claimed subject matter is not so limited.

According to an illustration, the floating diffusion region 506 can be reset to a known state before transfer of charge to it. Resetting of the floating diffusion region 506 can be effectuated by the reset transistor 510. For example, a reset signal can be received at a gate of the reset transistor 510 to cause resetting of the floating diffusion region 506. Further, the transfer transistor 504 can transfer charge (e.g., provided by the photodiode 502) to the floating diffusion region 506. The charge can be transferred based upon a transfer signal (TX) received at a gate of the transfer transistor 504. Light can be integrated at the photodiode 502 and electrons generated from the light can be transferred to the floating diffusion region 506 (e.g., in a noiseless or substantially noiseless manner) when the TX is received at the transfer transistor 504. Moreover, the pixel 500 (along with other pixel(s) in the same row of the pixel array) can be selected for readout by employing the select transistor 512. Readout can be effectuated via a read bus 514. Further, the source follower transistor 508 can output and/or amplify a signal representing a reset voltage (e.g., provided via a reset bus) and a pixel signal voltage based on the photo converted charges.

It is to be appreciated, however, that different pixel configurations other than the example illustrated in FIG. 5 are intended to fall within the scope of the hereto appended claims. For instance, a disparate pixel configuration can lack the transfer gate transistor 504 (e.g., a 3T pixel). According to another illustration, a differing pixel configuration can include more than four transistors. Furthermore, differing pixel configurations can have pixels sharing components in appropriate configurations to reduce the total number of transistors, capacitors, circuit elements and/or interconnects within each group of shared pixels. Yet, it is to be appreciated that the claimed subject matter is not limited to the aforementioned examples.

Figure 6:
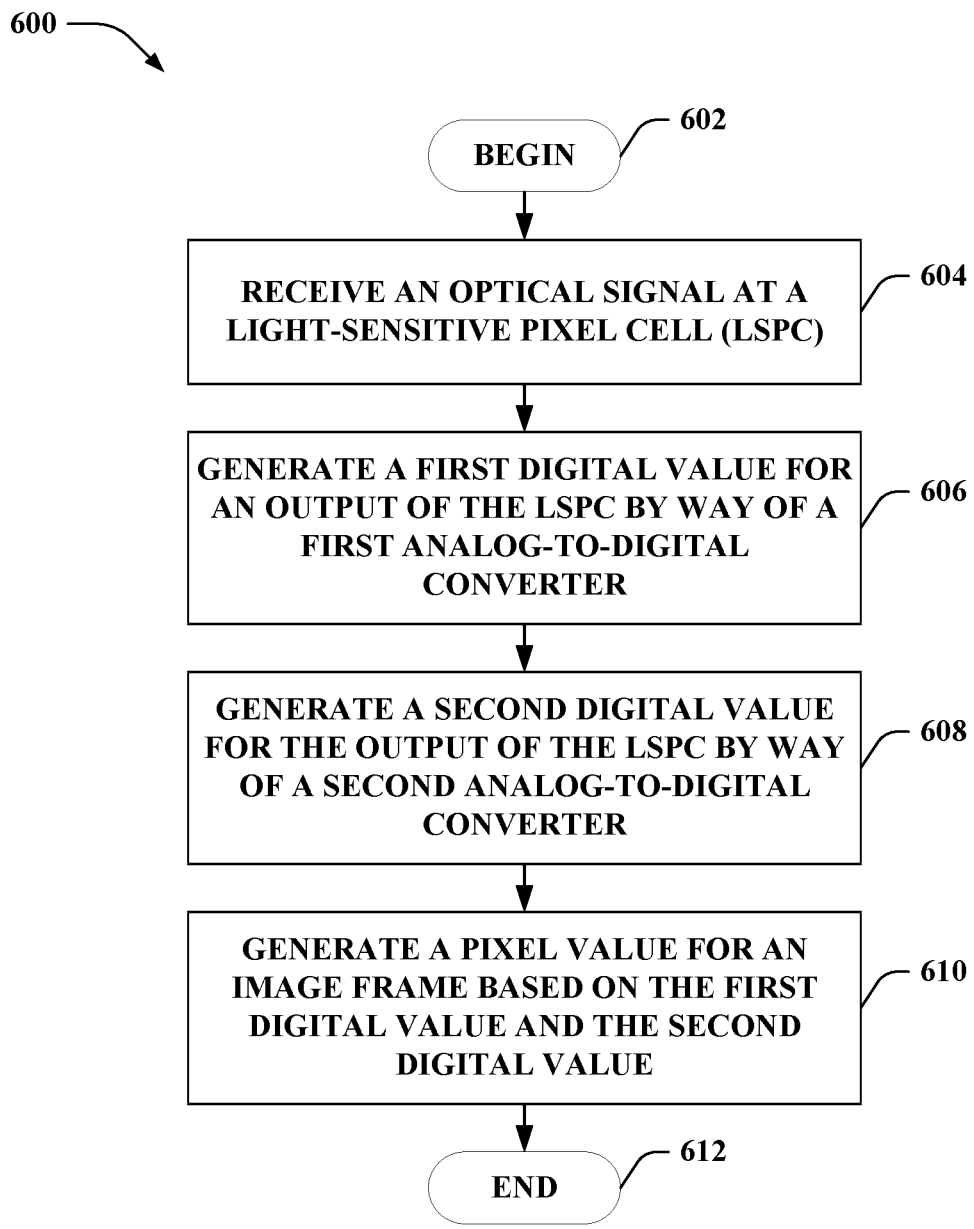
FIG. 6 is a flow diagram that illustrates an exemplary methodology for operation of a low-power image sensor.

FIG. 6 illustrates an exemplary methodology for operation of a low-power image sensor. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

The acts described herein may be implemented by an image sensor or an image signal processor. Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodology can be stored in a computer-readable medium, displayed on a display device, and/or the like.

Since layer 404 can be produced using a manufacturing process optimized for digital components, the instructions can be selectively programmed in lower cost memory by being integrated into the layer, including high density RAM, ROM, DRAM, SRAM, resistive RAM (ReRAM), EEPROM. etc., along with the necessary microcontroller signal processing support for performing various digital signal processing tasks including the ADC calibrations (both offset and linearity), combinatorial operations on the two, or more, digitized vales from each pixel to compose the aggregate dynamic range when appropriate for the specific imaging task (such as high dynamic range (HDR) imaging, perform lossless compression such as gamma processing, various types of DSP support for sigma-delta ADC converters (if such are employed in a resulting ADC pipeline), etc.

Referring now to FIG. 6, an exemplary methodology 600 for operation of a low-power image sensor is illustrated. The methodology 600 begins at 602 and at 604, an optical signal is received at an LSPC included in an image sensor. The LSPC is configured to generate a voltage output in response to receiving an optical signal. At 606, a first digital value that is representative of the voltage output of the LSPC is generated by way of a first ADC in the image sensor that samples the voltage output of the LSPC. In an exemplary embodiment, the voltage output of the LSPC can be provided to the first ADC by a readout circuit, where the voltage output of the LSPC may be amplified by the readout circuit prior to receipt at the first ADC. The first ADC samples the voltage output of the LSPC in a first dynamic range. At 608, a second digital value that is representative of the voltage output of the LSPC is generated by way of a second ADC included in the image sensor. The second ADC samples the voltage output of the LSPC in a second dynamic range. In embodiments, the second dynamic range can be greater than the first dynamic range, but can also be of equal dynamic range at the discretion of the associated signal processing. At 610, a pixel value for a pixel in an image frame is generated based upon the first digital value and the second digital value. In some embodiments, the pixel value is generated by selecting one of the first digital value or the second digital value as the pixel value for the pixel. In other embodiments, the pixel value can be generated by image processing circuitry based on any of various image composition algorithms that take into consideration s-curves, gamma curves, or the like over the total dynamic range of the image sensor (e.g., the total dynamic range extending across the first dynamic range of the first ADC and the second dynamic range of the second ADC). In further embodiments, the pixel levels can be extended to support high dynamic range imaging at the cost of embedding additional memory in the image sensor. The methodology 600 completes at 612.

Figure 7:
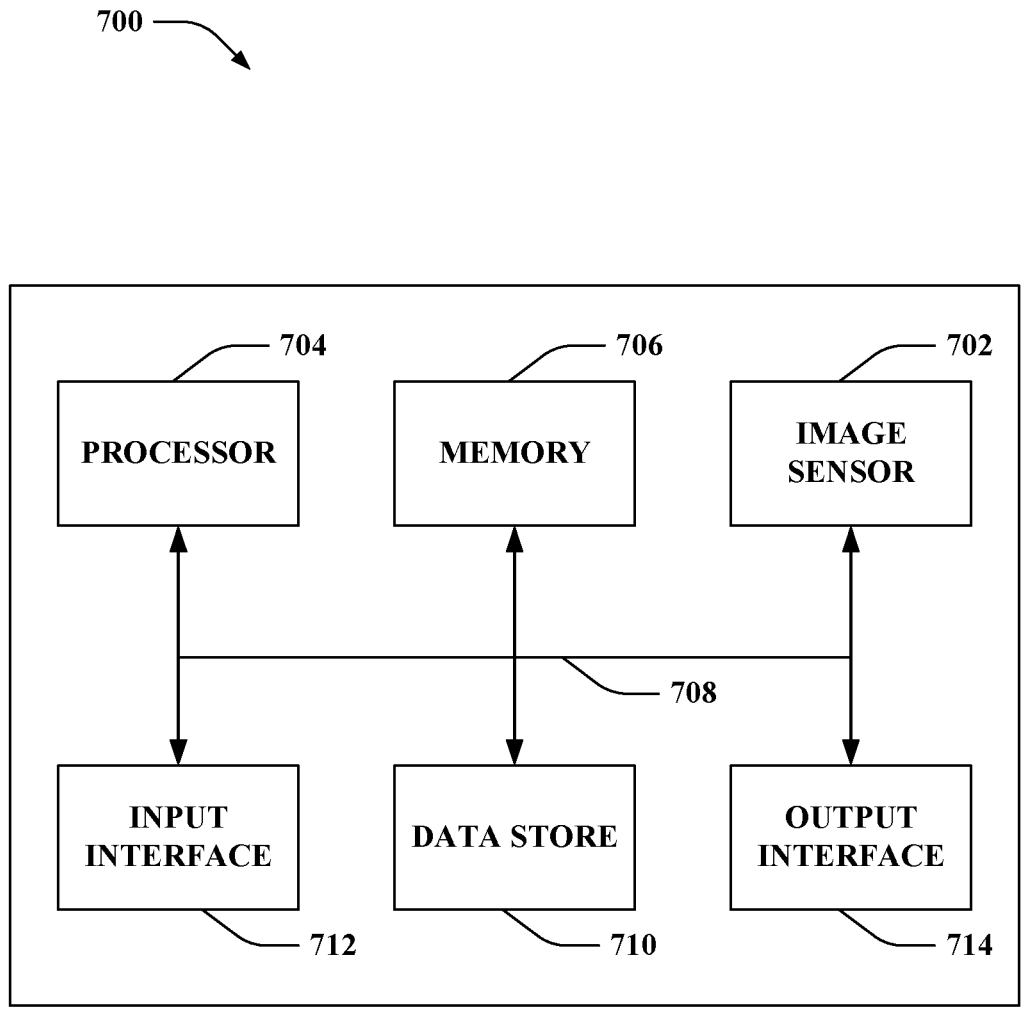
FIG. 7 illustrates an exemplary computing device.

Referring now to FIG. 7, a high-level illustration of an exemplary computing device 700 that can be used in accordance with the systems and methodologies disclosed herein is illustrated. For instance, the computing device 700 may employ a CMOS image sensor system on chip. According to another embodiment, one or more, or all components of the computing device 700 can be integrated in a CMOS image sensor system on chip. The computing device 700 includes at least one processor 702 that executes instructions that are stored in a memory 704. The processor 702 may access the memory 704 by way of a system bus 706.

The computing device 700 additionally includes a data store 708 that is accessible by the processor 702 by way of the system bus 706. The data store 708 may include executable instructions, etc. The computing device 700 also includes an input interface 710 that allows external devices to communicate with the computing device 700. For instance, the input interface 710 may be used to receive instructions from an external computer device, from a user, etc. The computing device 700 also includes an output interface 712 that interfaces the computing device 700 with one or more external devices. For example, the computing device 700 may display text, images, etc. by way of the output interface 712.

Additionally, while illustrated as a single system, it is to be understood that the computing device 700 may be a distributed system. Thus, for instance, several devices may be in communication by way of a network connection and may collectively perform tasks described as being performed by the computing device 700.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices.

Further, as used herein, the term "exemplary" is intended to mean "serving as an illustration or example of something."

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A signal sampling system comprising:
a first analog-to-digital converter (ADC) configured to output a first digital value that is representative of an analog signal by sampling the analog signal within a first dynamic range, wherein the first dynamic range extends from a first lower bound to a first upper bound;
a second ADC configured to output a second digital value that is representative of the analog signal by sampling the analog signal within a second dynamic range that is different from the first dynamic range, wherein the second dynamic range extends from a second lower bound to a second upper bound, and wherein the first dynamic range and the second dynamic range are at least partially non-overlapping; and processing circuitry that is configured to receive the first digital value and the second digital value and to output a final digital value that is representative of the analog signal based upon the first digital value and the second digital value.

2. The signal sampling system of claim 1, wherein the first lower bound and the first upper bound are respective first and second voltage values.

3. The signal sampling system of claim 1, wherein a value of a least significant bit (LSB) of the first digital value is greater than a value of an LSB of the second digital value.

4. The signal sampling system of claim 1, the first ADC further configured to output a third digital value that is representative of a second analog signal by sampling the second analog signal, and wherein the second ADC is further configured to output a fourth digital value that is representative of the second analog signal based upon the third digital value output by the first ADC.

5. The signal sampling system of claim 4, wherein the processing circuitry receives the third digital value from the first ADC, the processing circuitry configured to cause the second ADC to output the fourth digital value by sampling the second analog signal when the third digital value is below a threshold value, and wherein the second ADC fails to output the fourth digital value when the third digital value is above the threshold value.

6. The signal sampling system of claim 1, further comprising a light-sensitive pixel cell (LSPC), wherein the LSPC outputs the analog signal, the analog signal being indicative of light incident on the LSPC.

7. The signal sampling system of claim 1, wherein the first ADC is configured to sample a plurality of analog signals at a first frequency, the analog signal included in the plurality of analog signals, and wherein the second ADC is configured to selectively sample the plurality of analog signals at a second frequency different from the first frequency.

8. A sensor system, comprising:
a first analog-to-digital converter (ADC) configured to output a first digital value indicative of an analog signal received by the first ADC;
a second ADC; and
processing circuitry that is configured to receive the first digital value and to output a final digital value indicative of a value of the analog signal based upon the first digital value, the processing circuitry further configured to perform the following acts:
responsive to determining that the first digital value is below a threshold value, causing the second ADC to sample the analog signal to generate a second digital value indicative of the analog signal, wherein the processing circuitry outputs the final digital value based further upon the second digital value, wherein the second ADC fails to sample the signal when the first digital value is above the threshold value.

9. The sensor system of claim 8, the first ADC having a first sampling resolution and the second ADC having a second sampling resolution, wherein the second sampling resolution is greater than the first sampling resolution.

10. The sensor system of claim 8, the first ADC having a first sampling resolution and the second ADC having a second sampling resolution, wherein the second sampling resolution is less than the first sampling resolution.

11. The sensor system of claim 8, wherein the processing circuitry is configured to output the second digital value as the final digital value when the first digital value is below the threshold value.

12. The sensor system of claim 8, further comprising:
a plurality of ADCs, wherein the second ADC is included in the plurality of ADCs; and
a plurality of light-sensitive pixel cells (LSPCs), wherein the analog signal is output by a first LSPC in the plurality of LSPCs, and wherein each of the plurality of ADCs is assigned to a respective column of LSPCs in the plurality of LSPCs such that each ADC is configured to output digital values indicative of analog outputs of LSPCs in its assigned column.

13. The sensor system of claim 12, wherein the first ADC is configured to output digital values representative of output signals for a block of LSPCs in the plurality of LSPCs, wherein the block of LSPCs includes a plurality of columns of LSPCs.

14. The sensor system of claim 13, wherein the first ADC has a greater sampling frequency than the second ADC.

15. The sensor system of claim 8, wherein the first ADC is further configured to output a third digital value indicative of a second analog signal received by the first ADC, and wherein the second ADC is further configured to output a fourth digital value indicative of the second analog signal.

16. The sensor system of claim 8, wherein the first ADC outputs the first digital value by sampling the analog signal within a first dynamic range, wherein the second ADC is configured to generate the second digital value by sampling the analog signal within second dynamic range that is different from the first dynamic range.

17. The sensor system of claim 16, wherein the first dynamic range is greater than the second dynamic range.

18. A method for digitization of a sensor output, the method comprising:
receiving, at a first analog-to-digital converter (ADC), an analog signal output by a sensor, the first ADC configured to output a first digital value indicative of a value of the analog signal;
determining whether the first digital value exceeds a threshold value; and
responsive to determining that the first digital value does not exceed the threshold value:
causing a second ADC to output a second digital value indicative of the analog signal, wherein the first ADC has a first dynamic range, and wherein the second ADC has a second dynamic range that is smaller than the first dynamic range, and wherein further the second ADC fails to output the second digital value when the first digital value exceeds the threshold value; and
outputting, based upon the first digital value and the second digital value, an indication that a third digital value is representative of the value of the analog signal output by the sensor.

19. The method of claim 18, further comprising: responsive to determining that the first digital value meets or exceeds the threshold value, outputting an indication that the first digital value is representative of the value of the analog signal output by the sensor.

20. The method of claim 18, wherein the first dynamic range extends from a first lower bound to a first upper bound, and the second dynamic range extends from a second lower bound to a second upper bound, wherein the first dynamic range and the second dynamic range are at least partially non-overlapping.

\* \* \* \* \*